United States Patent
Lee et al.

(10) Patent No.: US 7,736,963 B2
(45) Date of Patent: Jun. 15, 2010

(54) METHOD OF FORMING A GATE STRUCTURE FOR A SEMICONDUCTOR DEVICE AND METHOD OF FORMING A CELL GATE STRUCTURE FOR A NON-VOLATILE MEMORY DEVICE

(75) Inventors: Woong Lee, Seoul (KR); Young-Sub You, Gyeonggi-do (KR); Hun-Hyeoung Leam, Gyeonggi-do (KR); Yong-Woo Hyung, Gyeonggi-do (KR); Jai-Dong Lee, Gyeonggi-do (KR); Ki-Su Na, Gyeonggi-do (KR); Jung-Hwan Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1018 days.

(21) Appl. No.: 11/175,569

(22) Filed: Jul. 5, 2005

(65) Prior Publication Data

US 2006/0003509 A1   Jan. 5, 2006

(30) Foreign Application Priority Data

Jul. 5, 2004   (KR) ............... 10-2004-0051880

(51) Int. Cl.
 *H01L 21/336* (2006.01)
(52) U.S. Cl. .............. 438/197; 438/165; 438/225; 438/297; 438/362; 438/431; 438/432; 438/635; 438/766; 438/680; 257/E21.082; 257/E21.283; 257/E21.558
(58) Field of Classification Search ............ 438/197
 See application file for complete search history.

(56) References Cited

U.S. PATENT DOCUMENTS 4,587,710 A * 5/1986 Tsao .................... 438/571
5,208,175 A * 5/1993 Choi et al. ............ 438/261

(Continued)

FOREIGN PATENT DOCUMENTS

JP     9-172011     6/1997

(Continued)

OTHER PUBLICATIONS

English language abstract of the Korean Publication No. 2004-0003922.

(Continued)

*Primary Examiner*—Fernando L Toledo
*Assistant Examiner*—Ankush k Singal
(74) *Attorney, Agent, or Firm*—Harness, Dickey & Pierce, P.L.C.

(57) ABSTRACT

In an embodiment, a method of forming a gate structure for a semiconductor device includes forming a preliminary gate structure on a semiconductor substrate. The preliminary gate structure includes a gate oxide pattern and a conductive pattern sequentially stacked on the substrate. Then, a re-oxidation process is performed to the substrate having the preliminary gate structure using an oxygen radical including at least one oxygen atom, so that an oxide layer is formed on a surface of the substrate and sidewalls of the preliminary gate structure to form the gate structure for a semiconductor device. The thickness of the gate oxide pattern is prevented from increasing, and the quality of the oxide layer is improved.

17 Claims, 8 Drawing Sheets

U.S. PATENT DOCUMENTS

| | | | | |
|---|---|---|---|---|
| 5,412,246 | A * | 5/1995 | Dobuzinsky et al. | 257/632 |
| 5,633,184 | A * | 5/1997 | Tamura et al. | 438/264 |
| 5,739,066 | A * | 4/1998 | Pan | 438/595 |
| 5,847,427 | A * | 12/1998 | Hagiwara | 257/324 |
| 5,897,353 | A * | 4/1999 | Kim et al. | 438/261 |
| 5,928,966 | A * | 7/1999 | Yamane | 438/725 |
| 6,040,241 | A * | 3/2000 | Lee et al. | 438/622 |
| 6,133,150 | A * | 10/2000 | Nakajima et al. | 438/694 |
| 6,198,144 | B1 * | 3/2001 | Pan et al. | 257/412 |
| 6,228,717 | B1 * | 5/2001 | Hazama et al. | 438/265 |
| 6,274,429 | B1 * | 8/2001 | Misra | 438/257 |
| 6,326,266 | B1 * | 12/2001 | Brambilla et al. | 438/258 |
| 6,368,984 | B1 * | 4/2002 | Tomita et al. | 438/773 |
| 6,486,067 | B1 * | 11/2002 | Shen et al. | 438/704 |
| 6,551,913 | B1 * | 4/2003 | Kim et al. | 438/592 |
| 6,566,210 | B2 | 5/2003 | Ajmera et al. | |
| 6,583,036 | B1 * | 6/2003 | Hayamizu | 438/585 |
| 6,624,023 | B1 | 9/2003 | Han et al. | |
| 6,660,587 | B2 * | 12/2003 | Ahn et al. | 438/257 |
| 6,696,331 | B1 * | 2/2004 | Yang et al. | 438/211 |
| 6,716,734 | B2 * | 4/2004 | Seitz et al. | 438/592 |
| 6,720,630 | B2 * | 4/2004 | Mandelman et al. | 257/406 |
| 6,746,925 | B1 * | 6/2004 | Lin et al. | 438/287 |
| 6,764,942 | B2 * | 7/2004 | Tu et al. | 438/635 |
| 6,770,538 | B2 * | 8/2004 | Li et al. | 438/297 |
| 6,803,622 | B2 * | 10/2004 | Matsuno et al. | 257/314 |
| 6,838,365 | B2 * | 1/2005 | Gilton et al. | 438/585 |
| 6,872,624 | B2 * | 3/2005 | Odake et al. | 438/264 |
| 6,905,927 | B2 * | 6/2005 | Ahn et al. | 438/257 |
| 6,987,056 | B2 * | 1/2006 | Lim et al. | 438/585 |
| 6,992,010 | B2 * | 1/2006 | Chou et al. | 438/694 |
| 7,060,558 | B2 * | 6/2006 | Hofmann et al. | 438/257 |
| 7,157,332 | B2 * | 1/2007 | Kwak | 438/257 |
| 7,179,746 | B2 * | 2/2007 | Ohmi et al. | 438/697 |
| 7,183,156 | B2 * | 2/2007 | Goldbach et al. | 438/248 |
| 7,425,480 | B2 * | 9/2008 | Ozawa et al. | 438/165 |
| 2001/0000112 | A1 * | 4/2001 | Lin et al. | 257/315 |
| 2002/0027259 | A1 * | 3/2002 | Ikemasu et al. | 257/499 |
| 2002/0048888 | A1 * | 4/2002 | Li et al. | 438/297 |
| 2002/0106859 | A1 * | 8/2002 | Odake et al. | 438/264 |
| 2002/0185738 | A1 * | 12/2002 | Kim et al. | 257/758 |
| 2003/0010972 | A1 | 1/2003 | Ajmera et al. | |
| 2004/0029354 | A1 * | 2/2004 | You et al. | 438/424 |
| 2004/0106281 | A1 * | 6/2004 | Tu et al. | 438/680 |
| 2004/0126988 | A1 * | 7/2004 | Hong et al. | 438/431 |
| 2004/0197980 | A1 * | 10/2004 | Ikemasu et al. | 438/202 |
| 2005/0009281 | A1 * | 1/2005 | Lim et al. | 438/287 |
| 2005/0153509 | A1 * | 7/2005 | Kwak | 438/257 |
| 2005/0266665 | A1 * | 12/2005 | Youn et al. | 438/592 |
| 2006/0073666 | A1 * | 4/2006 | Lim et al. | 438/303 |
| 2006/0110900 | A1 * | 5/2006 | Youn et al. | 438/592 |
| 2006/0270186 | A1 * | 11/2006 | Tsunomura et al. | 438/439 |
| 2007/0010068 | A1 * | 1/2007 | Lee et al. | 438/459 |
| 2007/0059943 | A1 * | 3/2007 | Li et al. | 438/771 |
| 2007/0066013 | A1 * | 3/2007 | Lim et al. | 438/257 |

FOREIGN PATENT DOCUMENTS

| | | |
|---|---|---|
| JP | 11-345970 | * 12/1999 |
| KR | 2004-0003922 | 1/2004 |
| KR | 2004-0054053 | 6/2004 |

OTHER PUBLICATIONS

English language abstract of the Korean Publication No. 9-172011.
English language abstract of Korean Publication No. 2004-0003922.
English language abstract of Korean Publication No. 2004-0054053.

* cited by examiner

METHOD OF FORMING A GATE STRUCTURE FOR A SEMICONDUCTOR DEVICE AND METHOD OF FORMING A CELL GATE STRUCTURE FOR A NON-VOLATILE MEMORY DEVICE

CROSS-REFERENCE TO RELATED APPLICATION

This application relies for priority upon Korean Patent Application No. 2004-51880 filed on Jul. 5, 2004, the content of which is herein incorporated by reference in its entirety.

BACKGROUND OF THE INVENTION

1. Field of the Invention

Embodiments of the present invention relate to a method of forming a gate structure for a semiconductor device and a method of a forming a cell gate structure for a non-volatile memory device using the same. More particularly, the present invention relates to a method of forming a gate structure having a minute line width for a semiconductor device and a method of forming a cell gate structure for a non-volatile memory device using the same.

2. Description of the Related Art

In general, semiconductor memory devices are classified into a volatile memory device, such as a random-access-memory (RAM) device and a non-volatile memory device, such as a read-only-memory (ROM) device. This classification is based on whether the data stored in the memory device is erased or not when its power is turned off. Data stored in a volatile memory device such as a dynamic RAM (DRAM) and a static RAM (SRAM) are volatile and erased when power is turned off. Data stored in the non-volatile memory device is not erased and its stored charge is maintained over time even though the power is turned off. While the volatile memory device has a high operation speed, the non-volatile memory device has a relatively low operation speed.

Typically, when a plurality of chips is fabricated on a silicon wafer, each of the chips is individually manufactured into the semiconductor memory device. Recently, as semiconductor devices have been highly integrated to fabricate more chips per wafer, a line width of a feature, such as a gate electrode, in a semiconductor device has been correspondingly reduced.

Figure 1:
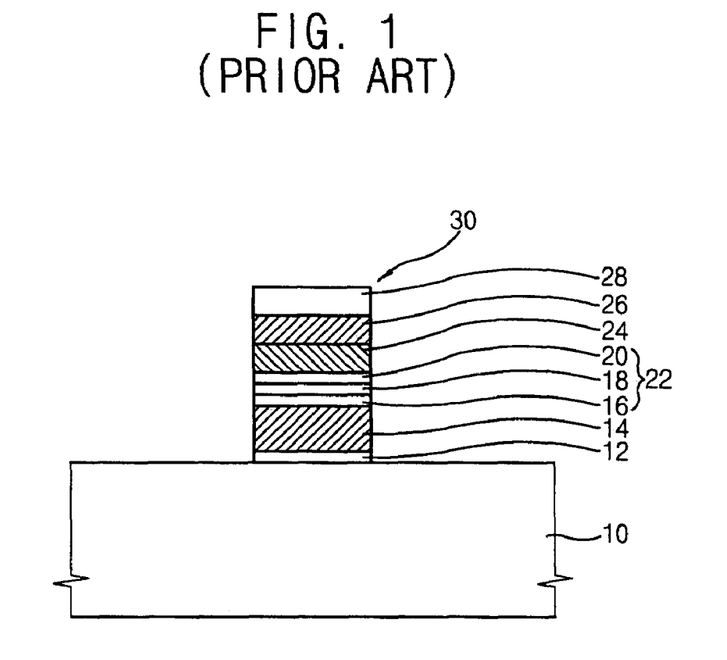
FIGS. 1 and 2 are cross-sectional views illustrating processing steps for a method of forming a cell gate structure for a conventional non-volatile memory device.
Figure 2:
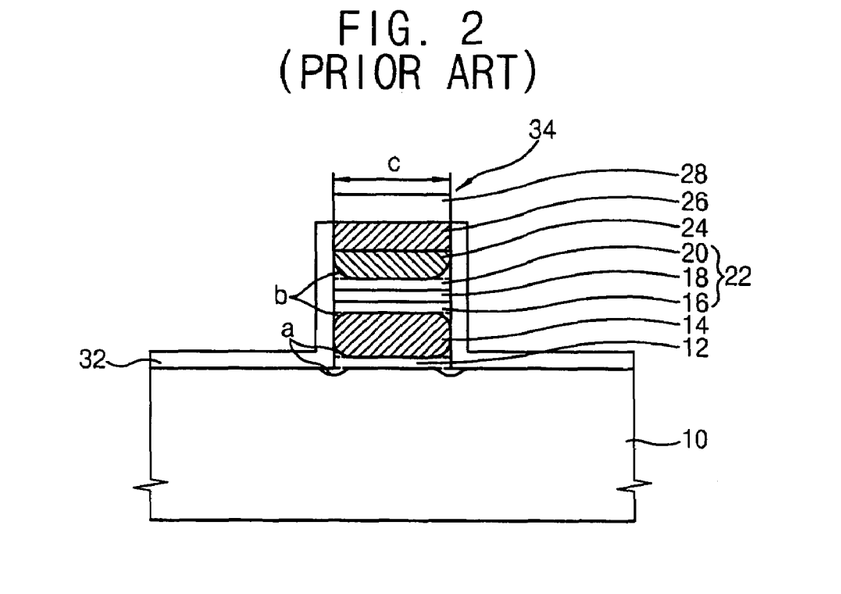

FIGS. 1 and 2 are cross-sectional views illustrating processing steps for a method of forming a cell gate structure for a conventional non-volatile memory device.

Referring to FIG. 1, a tunnel oxide pattern 12, a first conductive pattern 14, a dielectric interlayer pattern 22, a second conductive pattern 24, a metal silicide layer 26 and a hard mask pattern 28 are sequentially stacked on a semiconductor substrate 10 to form a preliminary cell gate structure 30.

In detail, a tunnel oxide layer is formed on the semiconductor substrate 10, and a first conductive layer is formed on the tunnel oxide layer. The first conductive layer is formed to be a floating gate electrode in a subsequent process. Polysilicon doped in-situ with N type or P type impurities is deposited on the tunnel oxide layer to form a first conductive layer.

Then, a dielectric (or insulating) interlayer is formed on the first conductive layer. The dielectric interlayer is multi-layer, including a first oxide layer, a silicon nitride layer, and a second oxide layer that are sequentially stacked on the first conductive layer, which is conventionally known as an ONO structure. A second conductive layer is formed on the dielectric interlayer, and is formed into a control gate electrode in a subsequent process. Polysilicon doped in-situ with N type or P type impurities is also deposited on the dielectric interlayer, thereby forming the second conductive layer.

A metal silicide layer is formed on the second conductive layer for reducing an electrical resistance of a cell gate structure that is to be formed in a subsequent process. In general, a tungsten silicide layer is formed as the metal silicide layer. Then, a hard mask layer is formed on the metal silicide layer for protecting the cell gate structure. In general, a silicon nitride layer is utilized as the hard mask layer.

Then, the hard mask layer, the metal silicide layer, the second conductive layer, the dielectric interlayer, the first conductive layer, and the tunnel oxide layer are sequentially patterned using a conventional photolithography process including an exposing process, a developing process, an etching process, etc. As a result, the tunnel oxide pattern 12, the first conductive pattern 14, the dielectric interlayer pattern 22, the second conductive pattern 24, the metal silicide layer 26, and the hard mask pattern 28 are sequentially stacked on the substrate 10 to thereby form the preliminary cell gate structure 30. The dielectric interlayer pattern 22 includes a first oxide pattern 16, a silicon nitride pattern 18, and a second oxide pattern 20.

Referring to FIG. 2, a re-oxidation process is performed to the substrate 10 including the preliminary cell gate structure 30. Thus an oxide layer 32 is formed on a surface of the substrate 10 and sidewalls of the preliminary cell gate structure 30 to form a cell gate structure 34. The substrate 10, including the preliminary cell gate structure 30, is loaded into a furnace, and a heat treatment is performed on the substrate 10 at a temperature of no less than about 800° C. and at an atmospheric pressure in an oxidation atmosphere. In general, when an etching process is performed on the layers above the substrate 10 to form the preliminary cell gate structure 30, high-energy ions cause damage to the surface of the substrate 10 and the sidewalls of the preliminary cell gate structure 30. The oxide layer formed by the re-oxidation process compensates for the damage and cures the damaged surfaces. In addition, the oxide layer formed by the re-oxidation process reduces the intensity of an electric field generated at an edge portion of the cell gate structure 34, thus the tunnel oxide pattern 12 in the cell gate structure 34 is prevented from breaking down.

However, when the re-oxidation process is completed, oxidants diffuse into both sidewalls of the tunnel oxide pattern 12 to generate a processing failure at the tunnel oxide pattern 12 known as a bird's beak, denoted as 'a' in FIG. 2. In addition, the oxidants are also diffused into both sidewalls of the dielectric interlayer pattern 22 to generate another bird's beak, denoted as 'b' at the dielectric interlayer pattern 22.

Recently, as semiconductor devices become highly integrated and features of the cell gate structure 34, such as those having a line width 'c' are reduced, the bird's beak extends towards central portions of the tunnel oxide pattern 12 and the dielectric interlayer pattern 22. The extended bird's beak increases the thickness of the tunnel oxide pattern 12 and the dielectric interlayer pattern 22, reducing the operating speed of the semiconductor device.

Figure 3:
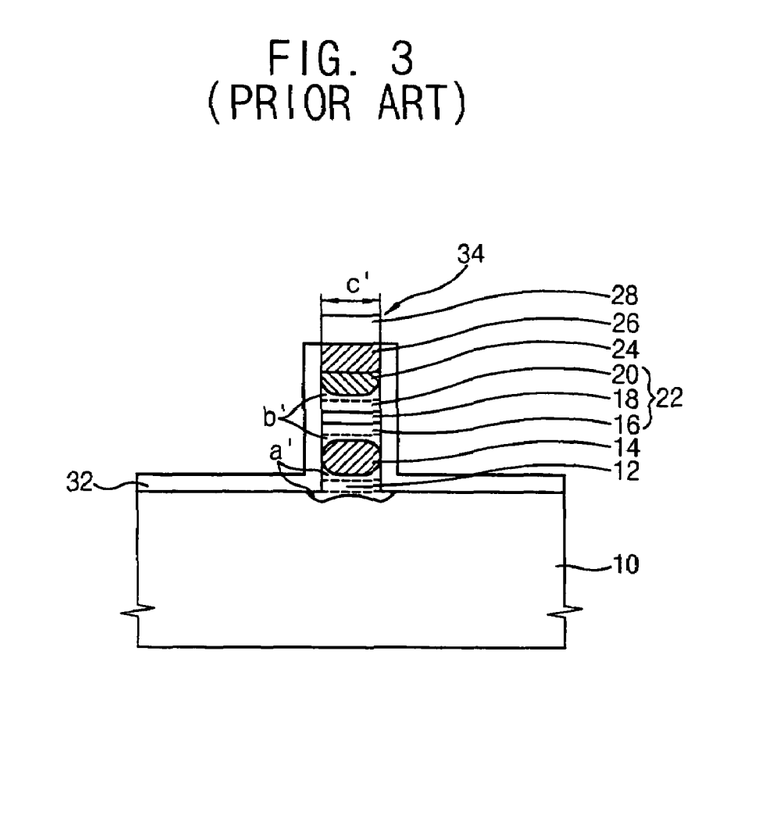
FIG. 3 is a view illustrating an extended bird's beak in the conventional non-volatile memory device.

FIG. 3 is a view illustrating the extended bird's beak in the conventional non-volatile memory device.

When the conventional line width c of the cell gate structure 34 shown in FIG. 2 is reduced to a line width c' shown in FIG. 3, the oxidants are diffused into the central portion of the tunnel oxide pattern 12 as well as the sidewalls, thus the substrate 10 under the central portion of the tunnel oxide pattern 12 and the first conductive pattern 14 on the central portion of the tunnel oxide pattern 12 are also partially oxidized during the re-oxidation process. That is, the bird's beak at sidewalls of the tunnel oxide pattern 12 is extended into the central portion, and an oxidized area is vertically enlarged in the tunnel oxide pattern 12 to increase the thickness of the tunnel oxide pattern 12.

In addition, the oxidants are also diffused into the central portion of the dielectric interlayer pattern 22 as well as the sidewalls, thus the first conductive layer 14 under the central portion of the dielectric interlayer pattern 22 and the second conductive pattern 24 on the central portion of the dielectric interlayer pattern 22 are also partially oxidized during the re-oxidation process. That is, the bird's beak at sidewalls of the dielectric interlayer pattern 22 is extended into the central portion, and an oxidized area is vertically enlarged in the dielectric interlayer pattern 22 to increase a thickness of the dielectric interlayer pattern 22. For these reasons, programming speed and erasing speed are reduced in the non-volatile memory device.

In addition, a programming threshold voltage differs greatly from an erasing threshold voltage due to a difference of line widths of a plurality of cell gate structures in the non-volatile memory device.

From the theoretical view, the line widths of cell gate structures in a conventional non-volatile memory device are all the same, but actual line widths of the cell gate structures are different from each other in an acceptable processing variation. Accordingly, when the re-oxidation process is performed in a cell gate structure having a relatively small line width, the oxidants are diffused further into a central portion of the cell gate structure than when the re-oxidation process is performed in a cell gate structure having a relatively large line width. That is, the bird's beak is more significant at a cell gate structure having a relatively small line width than at a cell gate structure having a relatively large line width, so that the thickness of the tunnel oxide pattern is proportionally greater at a cell gate structure having the relatively small line width. Accordingly, the thickness of the tunnel oxide pattern varies in accordance with the line width of the cell gate structure, and the thickness variation of the tunnel oxide pattern causes the threshold voltage difference.

Reducing the processing time for the re-oxidation process has been suggested for preventing the diffusion of the oxidants into the central portion of the cell gate structure. However, reducing the processing time also causes a problem in that the tunnel oxide pattern is insufficiently cured to deteriorate a bake-retention characteristic of a non-volatile memory device.

SUMMARY OF THE INVENTION

Embodiments of the present invention provide a method of forming a gate structure for preventing a thickness increase of a tunnel oxide pattern during a re-oxidation process.

Embodiments of the present invention also provide a method of forming a cell gate structure for a non-volatile memory device using the above method.

According to an exemplary embodiment of the present invention, a preliminary gate structure is formed on a semiconductor substrate, and the preliminary gate structure includes a gate oxide pattern and a conductive pattern sequentially stacked on the substrate. A re-oxidation process is performed on the substrate having the preliminary gate structure using an oxygen radical including at least one oxygen atom, so that an oxide layer is formed on a surface of the substrate and sidewalls of the preliminary gate structure.

According to another exemplary embodiment of the present invention, a method of forming a gate structure for a non-volatile memory device. A preliminary cell gate structure is formed on a substrate, and the preliminary cell gate structure includes a tunnel oxide pattern, a first conductive pattern, an interlayer dielectric pattern, and a second conductive pattern that are sequentially stacked on the substrate. A re-oxidation process is performed on the substrate having the preliminary gate structure using an oxygen radical including at least one oxygen atom, so that an oxide layer is formed on a surface of the substrate and sidewalls of the preliminary cell gate structure.

BRIEF DESCRIPTION OF THE DRAWINGS

The above and other features and advantages of the present invention will become readily apparent by reference to the following detailed description when considered in conjunction with the accompanying drawings, in which.

DESCRIPTION OF THE EMBODIMENTS

Embodiments of the present invention now will be described more fully hereinafter with reference to the accompanying drawings in which exemplary embodiments of the present invention are shown.

Figure 4:
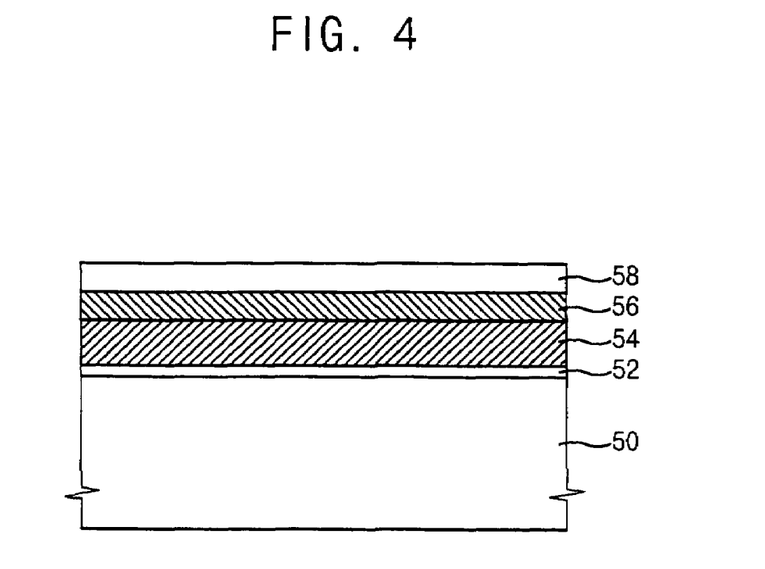
FIGS. 4 to 6 are cross-sectional views illustrating processing steps for forming a gate structure for a semiconductor device according to an embodiment of the present invention.
Figure 5:
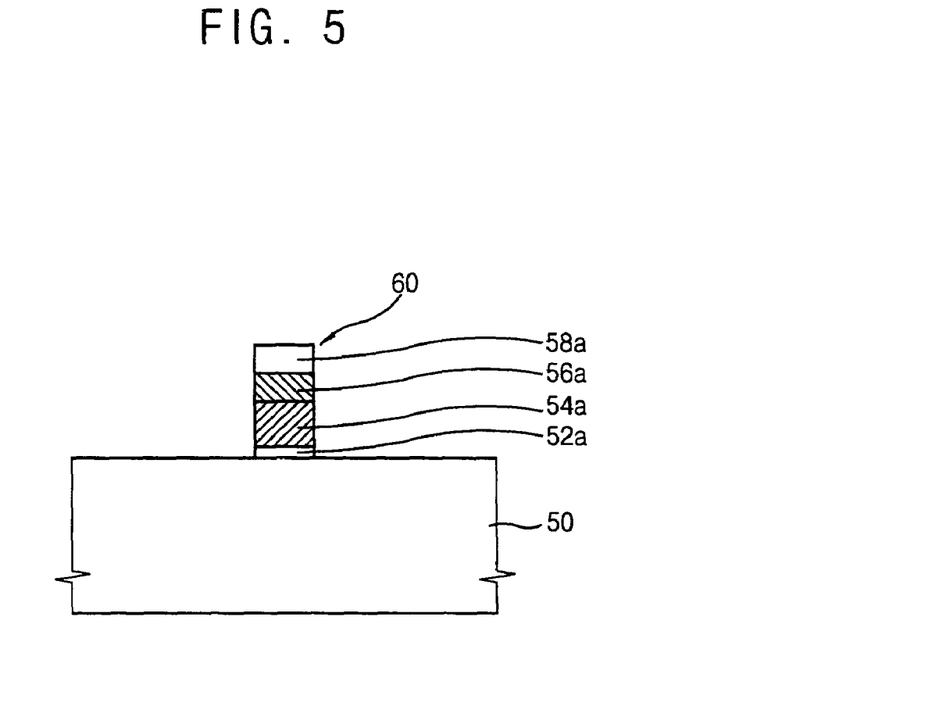
Figure 6:
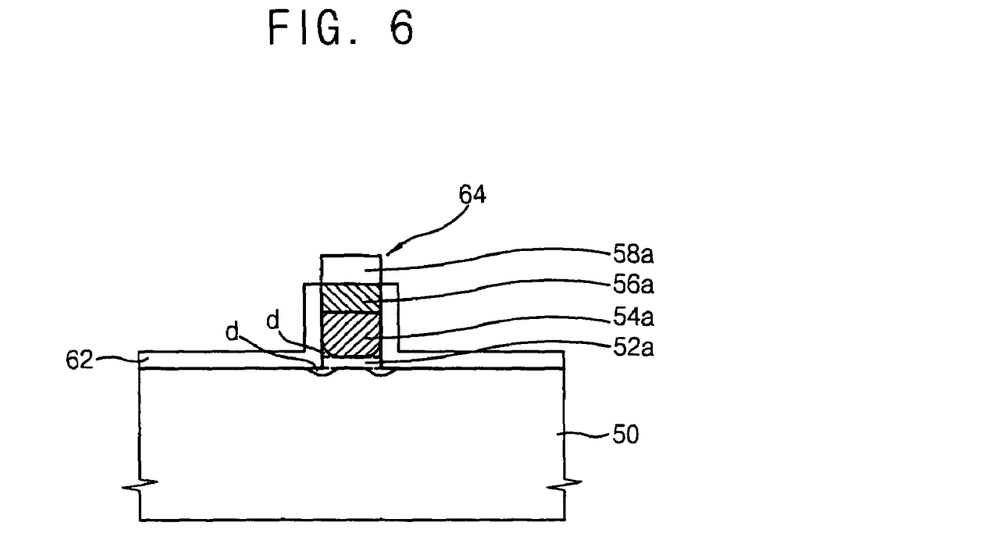

FIGS. 4 to 6 are cross-sectional views illustrating processing steps for forming a gate structure for a semiconductor device according to an embodiment of the present invention.

Referring to FIG. 4, an isolation layer (not shown) is formed on a silicon substrate 50 by a conventional isolation process such as a shallow trench isolation (STI) process and a local oxidation of silicon (LOCOS) process, so that an active region (not shown) is defined on the substrate 50. In the present embodiment, the STI process is utilized for the isolation layer.

Then, a gate oxide layer 52 is formed on the substrate 50 to a thickness of about 50 Å to about 200 Å by an oxidation process such as a thermal oxidation process, a rapid thermal oxidation process, a furnace thermal oxidation process, and a plasma oxidation process. In the present embodiment, the rapid thermal oxidation process is performed at a temperature of from about 800° C. to about 950° C. for a time period of from about 10 seconds to about 30 seconds with a pressure of a few Torr.

A conductive layer 54 is formed on the gate oxide layer 52. In detail, a polysilicon doped in-situ with N type or P type impurities is deposited onto the gate oxide layer 52 to a thickness of about 1,000 Å to about 1,500 Å. The conductive layer 54 is used for forming a gate electrode in a subsequent process.

A metal silicide layer 56 is formed on the conductive layer 54 for reducing the electrical resistance of the gate structure.

Examples of the metal silicide layer 56 include a tungsten silicide (WSi) layer, a cobalt silicide (CoSi) layer, a titanium silicide (TiSi) layer, a tantalum silicide (TaSi) layer, etc. Alternatively, a metal layer such as a tungsten (W) layer may be utilized in place of the metal silicide layer 56.

A hard mask layer 58 is formed on the metal silicide layer 56 for protecting the gate structure. A silicon nitride layer may be utilized as the hard mask layer 58.

Referring to FIG. 5, a photoresist pattern (not shown) is formed on the hard mask layer 58 in accordance with a pattern of the gate structure, and then the hard mask layer 58 is partially etched using the photoresist pattern as an etching mask to form a hard mask pattern 58a. Then, the photoresist pattern is removed from the hard mask pattern 58a.

The metal silicide layer 56, the conductive layer 54 and the gate oxide layer 52 are dry-etched using the hard mask pattern 58a as an etching mask to form a preliminary gate structure 60 including a gate oxide pattern 52a, a conductive pattern 54a, a metal silicide pattern 56a, and a hard mask pattern 58a that are sequentially stacked on the substrate 50.

Referring to FIG. 6, a re-oxidation process is performed on the substrate 50 on which the preliminary gate structure is formed, so that an oxide layer 62 is formed on a surface of the substrate 50 and sidewalls of the preliminary gate structure 60 to complete a gate structure 64.

When the etching is performed on the layers above the substrate 50 for forming the preliminary cell gate structure 60, high-energy ions cause damage to the surface of the substrate 50 and the sidewalls of the preliminary gate structure 60. The oxide layer 62 formed by the re-oxidation process compensates for this damage and cures the damaged surface of the substrate 50 and the damaged sidewalls of the preliminary gate structure 60.

In the present embodiment, the re-oxidation process is performed using an oxygen radical including at least one oxygen atom (hereinafter, referred to as atomic oxygen radical). The substrate 50 including the preliminary gate structure is loaded into a processing chamber, and a heat treatment is carried out in an atomic oxygen radical atmosphere. The atomic oxygen radical is generated by a free radical enhanced thermal oxidation (hereinafter, referred to as a free RTO) process widely known as an In-Situ Steam Generation (ISSG) process in the art. The free RTO process is carried out at a temperature of about 800° C. to about 1,050° C. and at a pressure of no more than about 20 Torr using a mixture of hydrogen ($H_2$) gas and oxygen ($O_2$) gas as a source gas. As an exemplary embodiment, an amount of the hydrogen ($H_2$) gas is in a range of about 1% to about 50% by volume based on a total volume of the mixture. The free RTO process is more preferably carried out at a temperature of about 950° C. and at a pressure of about 10 Torr using a mixture of hydrogen ($H_2$) gas and oxygen ($O_2$) gas as a source gas in which the amount of the hydrogen ($H_2$) gas is about 10% by volume based on a total volume thereof.

The hydrogen ($H_2$) and oxygen ($O_2$) gases are activated under the above conditions to generate atomic oxygen radicals such as O*, and OH* in the processing chamber. The atomic oxygen radical includes at least one high-reactive oxygen atom in the radical state, so that the silicon of the preliminary gate structure 60 and the substrate 50 is rapidly oxidized due to the atomic oxygen radicals. That is, the silicon on the preliminary gate structure 60 and the substrate 50 is oxidized to form the oxide layer 62 on the preliminary gate structure 60 and the substrate 50.

The conventional oxidants of the re-oxidation process are diffused into a central portion of the gate oxide pattern 52a from a sidewall thereof, so that the silicon around the central portion of the gate oxide pattern 52a is also oxidized to form a bird's beak. That is, the bird's beak is extended from both sidewalls into the central portion of the gate oxide pattern 52a, so that the thickness of the gate oxide pattern 52a is increased due to the extended bird's beak. However, the atomic oxygen radical of the present re-oxidation process is so highly reactive with respect to the silicon that the reactive time of the radical is very short. Accordingly, the atomic oxygen radical cannot reach the central portion of the gate oxide pattern 52a, so that the bird's beak is formed at both sidewalls of the gate oxide pattern 52a, thereby minimizing the increase of the thickness of the gate oxide pattern 52a.

Hereinafter, the present bird's beak is described in more detail in view of a reaction speed between the silicon and the oxidants as compared with the conventional bird's beak during the re-oxidation process to the substrate including the preliminary gate structure 60.

When the reaction speed between the silicon and the oxidants is sufficiently low during the re-oxidation process, the oxidants that are not reacted with the silicon infiltrate into the sidewalls of the gate oxide pattern 52a and are diffused into the central portion thereof. In such a case, the lower the reaction speed is, the more the oxidants infiltrate into the sidewalls, so that the lower the reaction speed is, the larger the oxidized silicon is around the central portion of the gate oxide pattern 52a. The conventional bird's beak is extended from the sidewalls to the central portion of the gate oxide pattern 52a.

In contrast, according to the present invention, when the reaction speed between the silicon and the oxidants is sufficiently high during the re-oxidation process, most of the oxidants are rapidly reacted with the silicon on the surface of the substrate 50 and sidewalls of the gate oxide pattern 52a, so that few oxidants have a chance to infiltrate into the sidewalls of the gate oxide pattern 52a. Thus the oxidants cannot easily reach the central portion of the gate oxide pattern 52a. That is, according to the present invention, the bird's beak is generated on the substrate 50 and an edge portion of the conductive pattern 54 around the gate oxide pattern 52a.

Accordingly, the atomic oxygen radical prevents the oxidants from being infiltrated into the central portion of the gate oxide pattern 52a during the re-oxidation process, so that a thickness of the gate oxide pattern 52a is not increased. In addition, the quality of the oxide layer 62 is improved due to the atomic oxygen radical.

FIGS. 7 to 14 are cross sectional views illustrating processing steps for forming a cell gate structure for a non-volatile memory device according to another embodiment of the present invention.

Figure 7:
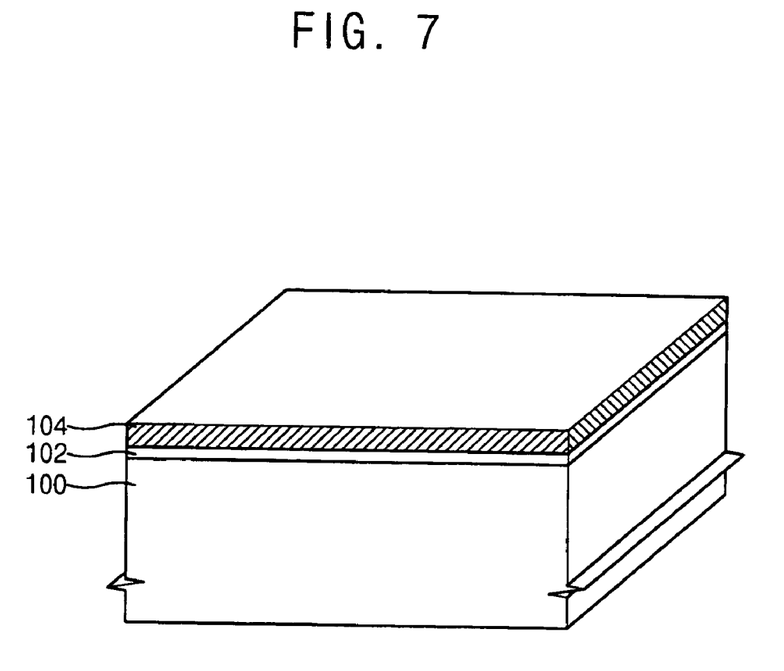
FIGS. 7 to 14 are cross-sectional views illustrating processing steps for forming a cell gate structure for a non-volatile memory device according to another embodiment of the present invention.

Referring to FIG. 7, a pad oxide layer is formed on a silicon substrate 100 to a thickness of about 100 Å, and a first hard mask layer 104 is formed on the pad oxide layer 102 to a thickness of about 700 Å. In the present embodiment, a silicon nitride layer is utilized as the first hard mask layer 104.

Figure 8:
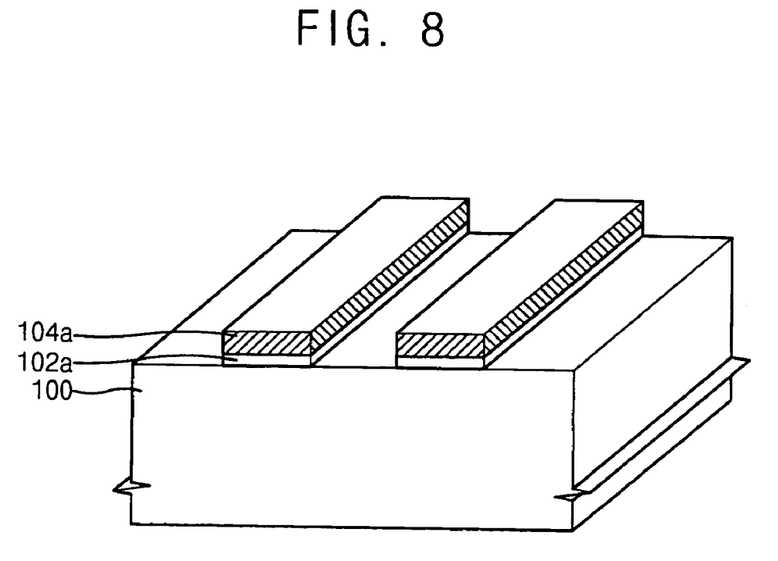

Referring to FIG. 8, a photoresist film (not shown) is coated on the first hard mask layer 104, and a conventional photo process is performed on the photoresist film to form a first photoresist pattern (not shown) on the first hard mask layer 104. Then, the first hard mask layer 104 and the pad oxide layer 102 are sequentially etched using the first photoresist pattern as an etching mask. The photoresist pattern is then removed by conventional ashing, stripping, and cleaning processes.

Figure 9:
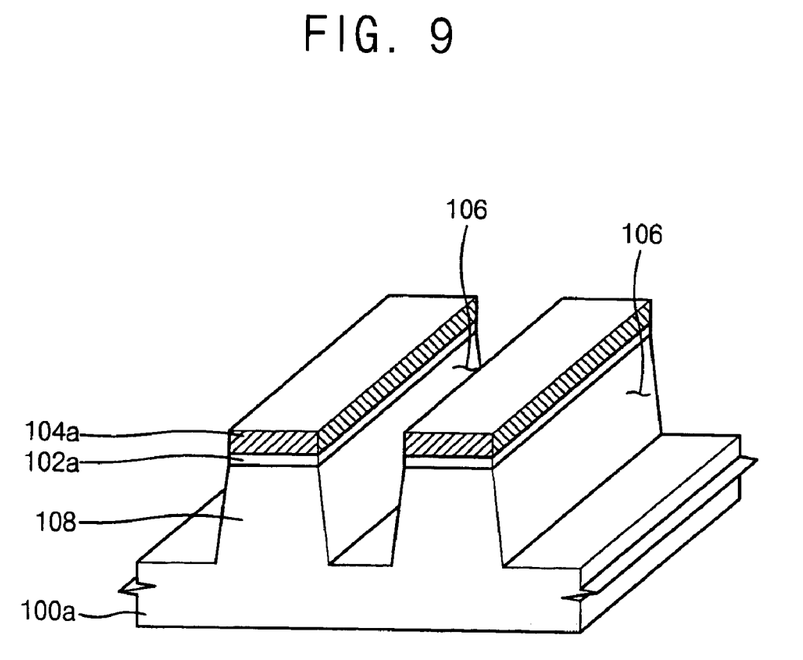

Referring to FIG. 9, the substrate 100 is dry etched using the first hard mask pattern 104a as an etching mask to form a trench 106 for defining an active pattern 108. In the present embodiment, the trench 106 is etched to a depth of about 2,000 Å, so that the active pattern 108 protrudes to a height of about 2,000 Å from a surface of the substrate 100a.

Figure 10:
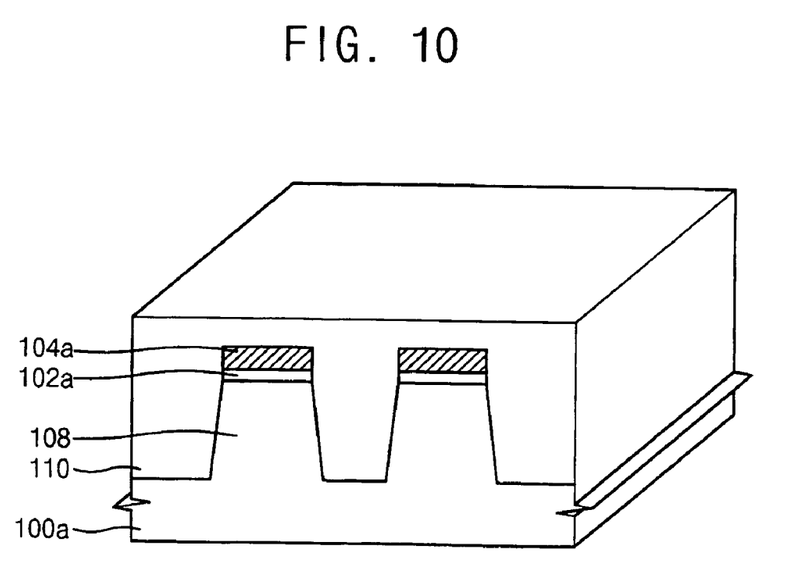

Referring to FIG. 10, a sidewall oxide layer (not shown) and a liner silicon nitride layer (not shown) are sequentially formed on the substrate 100a. The sidewall oxide layer relaxes stresses applied on the active pattern 108 by the etching process, and the liner silicon nitride layer prevents the active pattern from being oxidized. Then, an insulation layer 110 is formed on the substrate 100a to a sufficient thickness to fill the trench 106, so that the active pattern 108 and the first hard mask pattern 104a are covered with the insulation layer 110. As an exemplary embodiment, an oxide having a good gap filling characteristic such as an undoped silicate glass (USG) and tetraethyl orthosilicate (TEOS) is deposited onto the substrate 100a by a chemical vapor deposition (CVD) process to a thickness of about 5,000 Å, to form the insulation layer 110. Alternatively, the insulation layer 110 may be a high-density plasma oxide layer formed by a high-density plasma CVD process using a silane gas ($SiH_4$), an oxygen gas ($O_2$), and an argon (Ar) gas as a plasma source gas.

Figure 11:
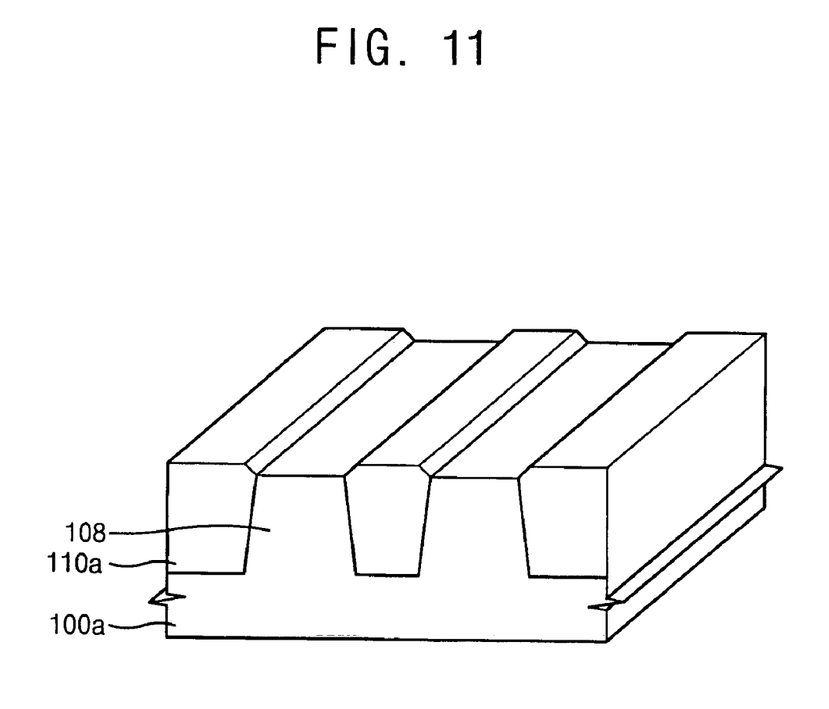

Referring to FIG. 11, the insulation layer 110 is partially removed and planarized by a chemical mechanical polishing (CMP) process until a top surface of the first hard mask pattern 104a is exposed. Then the first hard mask pattern 104a is removed by a phosphate strip process. Then, a pre-cleaning process is carried out using an etchant including a fluoric acid, and the pad oxide pattern 102a is removed from the substrate 100a during this pre-cleaning process. The planarized insulation layer 110 is removed by an amount of about 250 Å during the strip and pre-cleaning processes to thereby form an isolation layer 110a for defining and isolating the active region 108.

Figure 12:
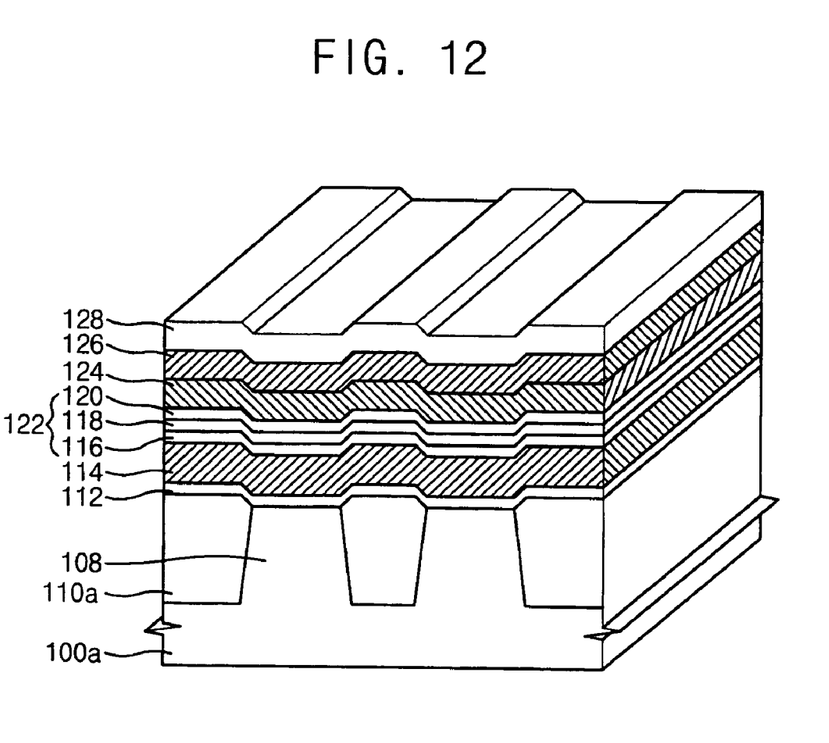

Referring to FIG. 12, a tunnel oxide layer 112 is formed on the substrate 100a including the isolation layer 110a, to a thickness of about 100 Å by an oxidation process such as a thermal oxidation process, a rapid thermal oxidation process, a furnace thermal oxidation process, and a plasma oxidation process. In the present embodiment, the rapid thermal oxidation process is performed for forming the tunnel oxide layer 112 at a temperature of about 800° C. to about 950° C. for a time period of about 10 seconds to about 30 seconds, with a pressure of a few Torr.

A first conductive layer 114 is formed on the tunnel oxide layer 112. In detail, a polysilicon doped in-situ with N type or P type impurities is deposited onto the tunnel oxide layer 112 to a thickness of about 300 Å to about 1,000 Å by a low pressure chemical vapor deposition (LPCVD) process, using a silane gas ($SiH_4$) as a silicon source gas and a phosphine ($PH_3$) gas as a dopant source gas. Therefore, the first conductive layer 114 exemplarily comprises a polysilicon layer doped with phosphorus (P). The phosphorus (P)-doped polysilicon layer is characterized by impurities that are uniformly doped in the first conductive layer 114, and the electrical resistance of the conductive layer 114 is easily controlled. The first conductive layer 114 is used for forming a gate electrode in a subsequent process.

Then, a first oxide layer 116, a silicon nitride layer 118 and a second oxide layer 120 are sequentially stacked on the first conductive layer 114 to form an interlayer dielectric layer 122. In the present embodiment, the first conductive layer 114 is oxidized to a thickness of about 45 Å to about 47 Å to form the first oxide layer 116. Then, a silicon nitride is deposited onto the first oxide layer 116 to a thickness of about 47 Å to about 49 Å to thereby form the silicon nitride layer 118. The second oxide layer 120 is formed on the silicon nitride layer 118 to a thickness of about 61 Å to about 63 Å. The first and second oxide layers 116 and 120 exemplarily comprise a material of high dielectric constant, and the silicon nitride layer comprises a material having a good leakage characteristic. A thickness of the interlayer dielectric layer 122 is formed to be small as much as possible within the limit that electrical charges readily conduct in the first conductive layer 114, so that a programming speed and an erasing speed are improved in the non-volatile memory device.

A second conductive layer 124 is formed on the interlayer dielectric layer 122. In detail, polysilicon doped in-situ with N type or P type impurities is deposited onto the interlayer dielectric layer 122 to a thickness of about 1,000 Å by a low pressure chemical vapor deposition (LPCVD) process using a silane gas ($SiH_4$) as a silicon source gas and a phosphine ($PH_3$) gas as a dopant source gas. Therefore, the second conductive layer 124 exemplarily comprises a polysilicon layer doped with phosphorus (P). The second conductive layer 124 is used for forming a control gate in a subsequent process, and a voltage is applied thereto for driving the non-volatile memory device.

A metal silicide layer 126 is formed on the second conductive layer 124 to a thickness of about 1,000 Å to about 1,500 Å for reducing the electrical resistance of the control gate electrode. Examples of the metal silicide layer 126 include a tungsten silicide (WSi) layer, a cobalt silicide (CoSi) layer, a titanium silicide (TiSi) layer, a tantalum silicide (TaSi) layer, etc. Alternatively, a metal layer such as a tungsten (W) layer may be utilized in place of the metal silicide layer 126.

A second hard mask layer 128 is formed on the metal silicide layer 126 for protecting a cell gate structure in a subsequent process. A silicon nitride layer may be utilized as the second hard mask layer 128.

Figure 13:
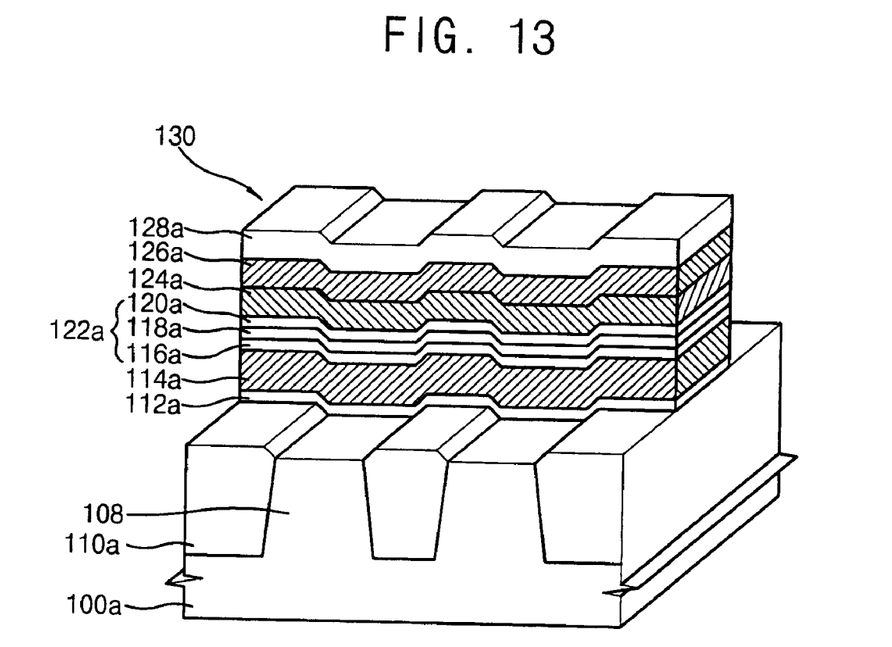

Referring to FIG. 13, a photoresist pattern (not shown) is formed on the second hard mask layer 128 in accordance with a pattern of the cell gate structure, and then the hard mask layer 128 is partially etched using the photoresist pattern as an etching mask to form a second hard mask pattern 128a. Then the photoresist pattern is removed from the second hard mask pattern 128a.

The metal silicide layer 126, the second conductive layer 124, the interlayer dielectric layer 122, the first conductive layer 114, and the tunnel oxide layer 112 are dry-etched using the second hard mask pattern 128a as an etching mask to form a preliminary cell gate structure 130, including a tunnel oxide pattern 112a, a first conductive pattern 114a, an interlayer dielectric layer 122a, a second conductive pattern 124a, a metal silicide pattern 126a, and a second hard mask pattern 128a that are sequentially stacked on the substrate 100a.

Figure 14:
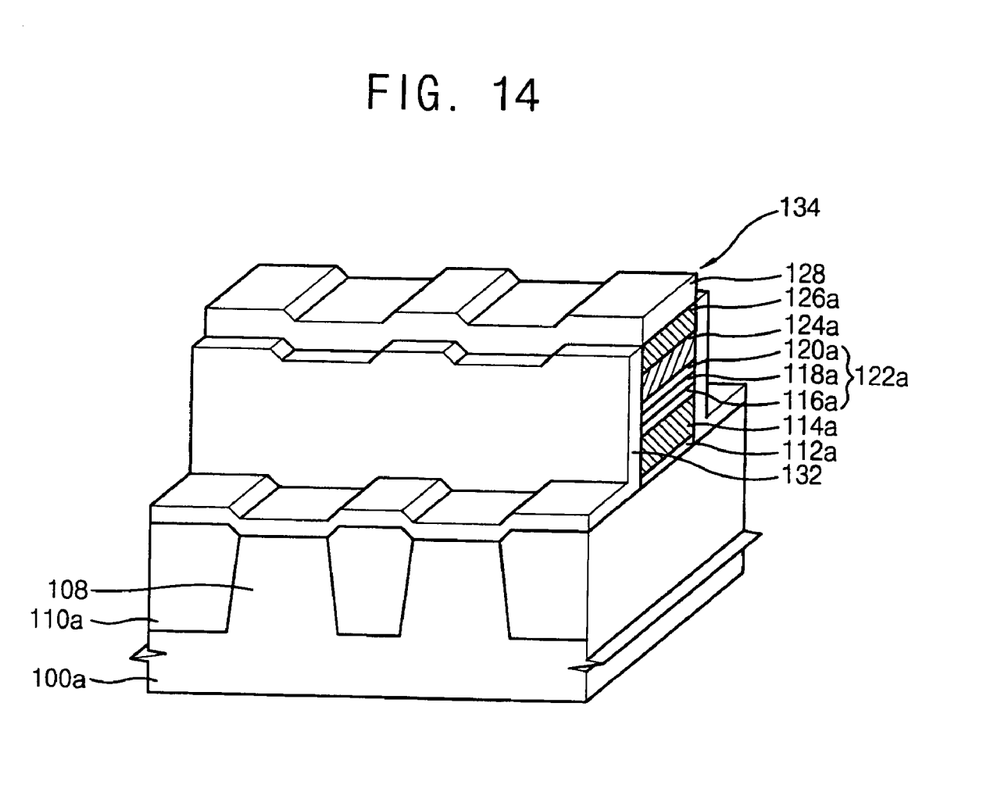

Referring to FIG. 14, a re-oxidation process is performed on the substrate 100a on which the preliminary cell gate structure 130 is formed, so that an oxide layer 132 is formed on a surface of the substrate 100a and sidewall of the preliminary cell gate structure 130 to thereby complete a cell gate structure 134 of a non-volatile memory device.

When the etching is performed against the above layers on the substrate 100a for forming the preliminary cell gate structure 130, high-energy ions cause damage to the surface of the substrate 100a and the sidewalls of the preliminary gate structure 130. The oxide layer 132 formed by the re-oxidation process compensates for this damage and cures the damaged surface of the substrate 100a and the damaged sidewalls of the preliminary cell gate structure 130.

In the present embodiment, the re-oxidation process is performed using an oxygen radical including at least one oxygen atom (hereinafter, referred to as atomic oxygen radical). The substrate 100a including the preliminary cell gate structure 130 is loaded into a processing chamber, and a heat treatment is carried out in an atomic oxygen radical atmosphere. The atomic oxygen radical is generated by a free RTO process widely known as an In-Situ Steam Generation (ISSG) process in the art. The free RTO process is carried out at a temperature of about 800° C. to about 1,050° C. and at a pressure of no more than about 20 Torr using a mixture of hydrogen ($H_2$) gas and oxygen ($O_2$) gas as a source gas. As an exemplary embodiment, an amount of the hydrogen ($H_2$) gas is in a range of about 1% to about 50% by volume based on a total volume of the mixture. The free RTO process is more preferably carried out at a temperature of about 950° C. and at a pressure of about 10 torr using a mixture of hydrogen ($H_2$) gas and oxygen ($O_2$) gas as a source gas in which the amount of the hydrogen ($H_2$) gas is about 10% by volume based on a total volume thereof.

The hydrogen ($H_2$) and oxygen ($O_2$) gases are activated under the above conditions to generate atomic oxygen radicals such as O* and OH* in the processing chamber. The atomic oxygen radical includes at least one high-reactive oxygen atom in the radical, so that the silicon of the preliminary cell gate structure 130 and the substrate 100a is rapidly oxidized due to the atomic oxygen radicals. That is, the silicon on the preliminary cell gate structure 130 and the substrate 100a is oxidized to form the oxide layer 132 on the preliminary cell gate structure 130 and the substrate 100a.

The conventional oxidants of the re-oxidation process are diffused into a central portion of the tunnel oxide pattern 112a and the interlayer dielectric layer 116a from a sidewall thereof, so that the silicon around the central portion of the tunnel oxide pattern 112a and the interlayer dielectric layer 116a is also oxidized to form a bird's beak.

The oxidants diffused into the central portion of the tunnel oxide pattern 112a are reacted with the silicon in the substrate 100a under the tunnel oxide pattern 112a and with the silicon in the first conductive pattern 114a on the tunnel oxide pattern 112a, so that the bird's beak is extended from both sidewalls into the central portion of the tunnel oxide pattern 112a, and the thickness of the tunnel oxide pattern 112a is increased due to the extended bird's beak.

The oxidants diffused into the central portion of the dielectric interlayer pattern 122a are also reacted with the silicon in the first conductive pattern 114a under the dielectric interlayer pattern 122a and to the silicon in the second conductive pattern 124a on the dielectric interlayer pattern 122a, so that the bird's beak is extended from both sidewalls into the central portion of the dielectric interlayer pattern 122a, and the thickness of the dielectric interlayer pattern 122a is also increased due to the extended bird's beak.

However, the atomic oxygen radical of the present re-oxidation process is so highly reactive with respect to the silicon that the reactive time of the atomic oxygen radical is very short. Accordingly, the atomic oxygen radical cannot reach the central portion of the tunnel oxide pattern 112a and the interlayer dielectric layer 122a, so that the bird's beak is formed at both sidewalls of the tunnel oxide pattern 112a and the interlayer dielectric layer 122a to thereby minimize the increase of the thickness of the tunnel oxide pattern 112a and the interlayer dielectric layer 122a.

Accordingly, the atomic oxygen radical prevents the oxidants from infiltrating into the central portion of the tunnel oxide pattern 112a and the interlayer dielectric layer 122a during the re-oxidation process, and thus a thickness of the tunnel oxide pattern 112a and the interlayer dielectric layer 122a is not increased. As a result, the programming voltage and the erasing voltage of each cell gate structure become more uniform in a non-volatile memory device including a plurality of cell gate structures. In addition, the quality of the oxide layer 132 is improved due to the atomic oxygen radical.

Test of the Thickness Change of the Cell Gate Structure

A re-oxidation process of an embodiment using atomic oxygen radicals was carried out on a silicon substrate including the preliminary cell gate structure to form an experimental oxide layer on the substrate and sidewalls of the preliminary cell gate structure. A conventional re-oxidation process without atomic oxygen radicals was also carried out on a silicon substrate including the same preliminary cell gate structure to form a conventional oxide layer on the substrate and sidewalls of the preliminary cell gate structure.

The experimental oxide layer was formed at a temperature of about 950° C. and at a pressure of about 10 torr using a mixture of hydrogen ($H_2$) gas and oxygen ($O_2$) gas as a source gas in which the amount of the hydrogen ($H_2$) gas was about 10% by volume based on a total volume. The conventional oxide layer was formed at a temperature of about 850° C. and at a room pressure in an oxidation atmosphere. The experimental oxide layer and the conventional oxide layer were formed to such a thickness that an oxide layer was formed to a thickness of about 46 Å on a flat surface of a bare silicon wafer during the re-oxidation process. The thickness change on the tunnel oxide pattern and the dielectric interlayer pattern is shown in Table 1.

A thickness of the tunnel oxide pattern and the interlayer dielectric layer of the preliminary cell gate structure was the same regardless of the atomic oxygen radicals since the preliminary cell gate structure was formed before the re-oxidation process was carried out, so that the thickness change measured in the present test indicates the thickness increase due to the re-oxidation process.

TABLE 1

| | Thickness change at the tunnel oxide pattern | | Thickness change at the interlayer dielectric pattern | |
|---|---|---|---|---|
| | Central portion | Sidewalls | Central portion | Sidewalls |
| Re-oxidation process of an embodiment | 1 Å | 2 Å | 1 Å | 4 Å |
| Conventional re-oxidation process | 3 Å | 3 Å | 14 Å | 16 Å |

As shown in Table 1, the tunnel oxide pattern was increased by about 1 Å at the central portion and about 2 Å at both sidewalls. The interlayer dielectric layer was increased by about 1 Å at the central portion and about 4 Å at both sidewalls according to a re-oxidation process using the atomic oxygen radicals according to an embodiment. However, the tunnel oxide pattern was increased by about 3 Å at the central portion and about 3 Å at both sidewalls, and the interlayer dielectric layer was increased by about 14 Å at the central portion and about 16 Å at both sidewalls according to the conventional re-oxidation process without the atomic oxygen radicals.

This test of thickness change of the cell gate structure shows that the thicknesses of the tunnel oxide pattern and the dielectric interlayer pattern of an embodiment of the present invention were not increased compared with the conventional re-oxidation process. In particular, the effect of preventing the thickness change was more remarkable at the interlayer dielectric layer.

Test of the Variance of the Programming Voltage

A re-oxidation process of an embodiment using atomic oxygen radicals was carried out on a silicon substrate including the preliminary cell gate structure to form an experimental oxide layer on the substrate and sidewalls of the preliminary cell gate structure. A conventional re-oxidation process without atomic oxygen radicals was also carried out on a silicon substrate including the same preliminary cell gate structure to form a conventional oxide layer on the substrate and sidewalls of the preliminary cell gate structure, as described earlier.

Figure 15:
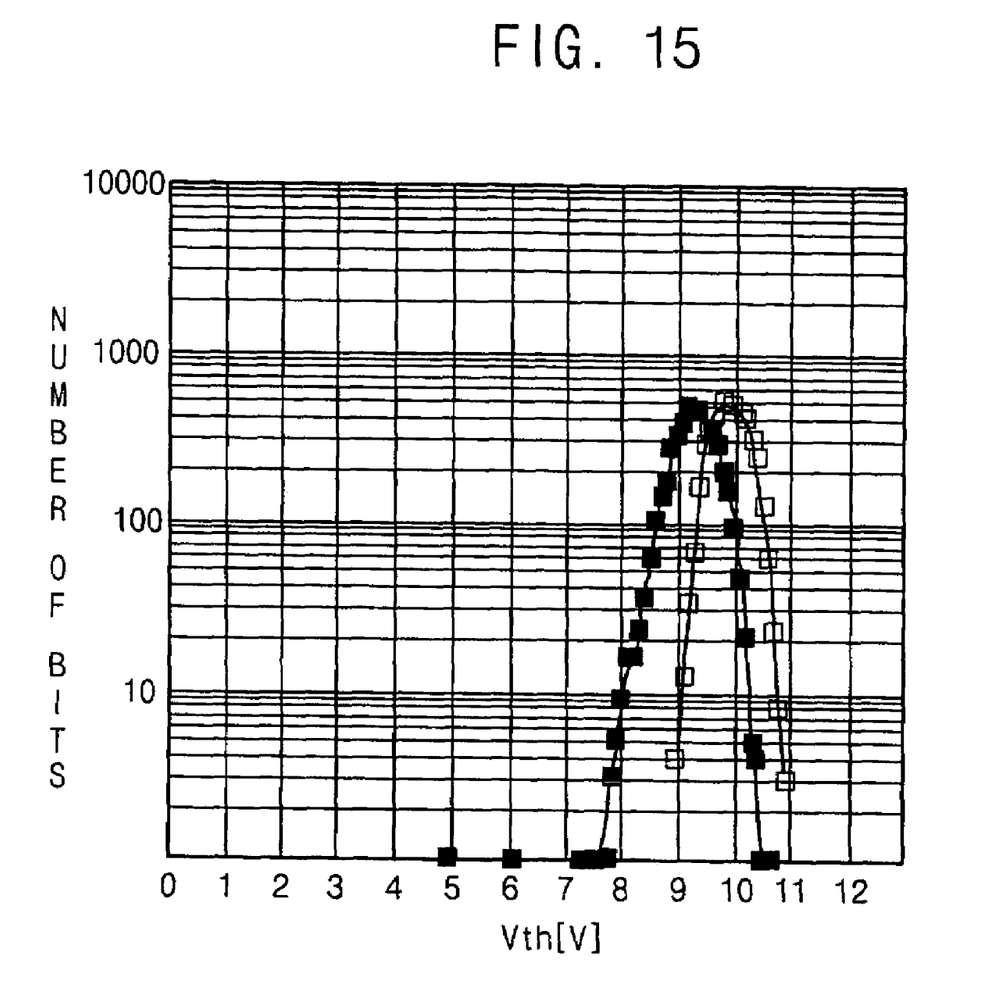
FIG. 15 is a graph showing a variance of the threshold voltage (Vth) of a non-volatile memory device at a programming voltage in accordance with a conventional re-oxidation process and the present re-oxidation process using atomic oxygen radicals.

FIG. 15 is a graph showing a variance of a threshold voltage (Vth) of a non-volatile memory device at a programming voltage in accordance with both a conventional re-oxidation process and a re-oxidation process using the atomic oxygen radicals according to an embodiment. In FIG. 15, the X-axis indicates the programming voltage and the Y-axis indicates a number of bits each of which corresponds to a cell gate structure. In addition, '□' indicates data measured in accordance with a re-oxidation process of the present embodiment, using the atomic oxygen radicals, and '■' indicates data measured in accordance with the conventional re-oxidation process without the atomic oxygen radicals.

As shown in FIG. 15, a variation of the programming voltage of the present cell gate structure of the present embodiment was about 1.9V, and a variation of the programming voltage of the conventional cell gate structure was about 3V.

This test of the variance of the programming voltage indicates that the variance of the programming voltage was reduced as compared with the conventional programming voltage in a non-volatile memory device.

Test of a Bake Retention of the Present Cell Gate Structure

A present re-oxidation process of an embodiment using atomic oxygen radicals was carried out on a silicon substrate including the preliminary cell gate structure to form an experimental oxide layer on the substrate and sidewalls of the preliminary cell gate structure, as described earlier.

Then, the substrate including the cell gate structure was maintained at a temperature of about 300° C. for about twelve hours, and then the programming voltage of the cell gate structure was measured to be about 0.8V, which is less than a guide voltage of about 1V in a non-volatile memory device.

The test of the bake retention indicates that the re-oxidation process using the atomic oxygen radicals sufficiently compensates for process damage and cures the damaged tunnel oxide pattern in a non-volatile memory device.

According to the present invention, the atomic oxygen radical prevents the oxidants from being infiltrated into the central portion of the gate structure during the re-oxidation process, and thus the thickness of the gate structure is not increased. In addition, the quality of the oxide layer is improved.

Although the exemplary embodiments of the present invention have been described, it is understood that the present invention should not be limited to these exemplary embodiments, but various changes and modifications can be made by one skilled in the art within the spirit and scope of the present invention as hereinafter claimed.

What is claimed is:

1. A method of forming a gate structure for a semiconductor device, comprising:
    forming a preliminary gate structure on a semiconductor substrate, the preliminary gate structure including a gate oxide pattern and a conductive pattern sequentially stacked on the substrate; and
    performing a re-oxidation process to the substrate having the preliminary gate structure using at least one atomic oxygen radical, so that an oxide layer is formed on a surface of the substrate and sidewalls of the preliminary gate structure,
    the at least one atomic oxygen radical including at least one of O* and OH* and being formed at a temperature of about 800° C. to about 1,050° C. and at a pressure of no more than about 20 Torr using a mixture of hydrogen (H2) gas and oxygen (O2) gas as a source gas.

2. The method of claim 1, wherein an amount of the hydrogen (H2) gas is in a range of about 1% to about 50% by volume based on a total volume of the mixture.

3. The method of claim 1, wherein the conductive pattern comprises polysilicon doped with impurities.

4. The method of claim 1, wherein a bird's beak is formed at the sidewalls.

5. A method of forming a gate structure for a semiconductor device, comprising:
    forming a preliminary cell gate structure on a substrate, the preliminary cell gate structure including a tunnel oxide pattern, a first conductive pattern, an interlayer dielectric pattern, and a second conductive pattern that are sequentially stacked on the substrate; and
    performing a re-oxidation process to the substrate having the preliminary gate cell structure using an oxygen radical including at least one oxygen atom, so that an oxide layer is formed on a surface of the substrate and sidewalls of the preliminary cell gate structure,
    the oxygen radical including at least one of O* and OH* and being formed at a temperature of about 800° C. to about 1,050° C. and at a pressure of no more than about 20 Torr using a mixture of hydrogen (H2) gas and oxygen ($O_2$) gas as a source gas.

6. The method of claim 5, wherein an amount of the hydrogen (H2) gas is in a range of about 1% to about 50% by volume based on a total volume of the mixture.

7. The method of claim 5, wherein the interlayer dielectric pattern includes a first oxide pattern, a silicon nitride pattern and a second oxide pattern that are sequentially stacked on the first conductive pattern.

8. The method of claim 5, wherein the first conductive pattern comprises polysilicon doped with impurities.

9. The method of claim 5, wherein a birds beak is formed at the sidewalls.

10. A method of forming a gate structure for a semiconductor device, comprising:
    forming an isolation layer on a substrate, to define an active region; sequentially forming a tunnel oxide layer, a first conductive layer, an interlayer dielectric layer, a second conductive layer, a third conductive layer, and a hard mask layer on the substrate; forming a hard mask pattern by patterning the hard mask layer;
    forming a preliminary cell gate structure by etching the third conductive layer, the second conductive layer, the interlayer dielectric layer, the first conductive layer, and the tunnel oxide layer using the hard mask pattern as an etching mask; and
    performing a re-oxidation process to the substrate having the preliminary cell gate structure using an oxygen radical including at least one oxygen atom, so that an oxide layer is formed on a surface of the substrate and sidewalls of the preliminary cell gate structure,
    the oxygen radical including at least one of O* and OH* and being formed at a temperature of about 800° C. to about 1,050° C. and at a pressure of no more than about 20 Torr using a mixture of hydrogen (H2) gas and oxygen (O2) gas as a source gas.

11. The method of claim 10, wherein an amount of the hydrogen (H2) gas is in a range of about 1% to about 50% by volume based on a total volume of the mixture.

12. The method of claim 10, wherein the dielectric interlayer pattern includes a first oxide pattern, a silicon nitride pattern and a second oxide pattern that are sequentially stacked on the first conductive pattern.

13. The method of claim 10, wherein the first and second conductive layers comprise polysilicon doped with impurities.

14. The method of claim 10, wherein the third conductive layer includes a tungsten silicide (WSi) layer, a cobalt silicide (CoSi) layer, a titanium silicide (TiSi) layer or a tantalum silicide (TaSi) layer.

15. The method of claim 10, wherein the third conductive layer includes a tungsten layer.

16. The method of claim 10, wherein a bird's beak is formed at the sidewalls.

17. The method of claim 10, wherein the oxide layer is formed on each of substantially the entire sidewalls.

* * * * *